United States Patent [19]

Yoon et al.

[11] Patent Number: 5,281,759
[45] Date of Patent: Jan. 25, 1994

[54] SEMICONDUCTOR PACKAGE

[75] Inventors: Jin H. Yoon; Oh S. Kwon, both of Seoul, Rep. of Korea

[73] Assignee: Samsung Electronics Co., Ltd., Suweon, Rep. of Korea

[21] Appl. No.: 778,451

[22] Filed: Oct. 15, 1991

[30] Foreign Application Priority Data

Apr. 16, 1991 [KR] Rep. of Korea .................. 91-6052

[51] Int. Cl.5 ............................................ H01L 23/02
[52] U.S. Cl. .................................... 174/52.4; 257/678
[58] Field of Search ............... 174/52.2, 52.4; 357/70, 357/74; 437/209, 215, 217, 220

[56] References Cited

U.S. PATENT DOCUMENTS

| | | | |
|---|---|---|---|
| 4,513,355 | 4/1985 | Schroeder et al. | 361/403 |
| 4,761,518 | 8/1988 | Butt et al. | 174/52.4 |
| 4,891,687 | 2/1990 | Mallik et al. | 357/70 |
| 4,897,508 | 1/1990 | Mahulikar et al. | 174/524 |
| 4,925,024 | 5/1990 | Ellenberger et al. | 206/328 |
| 5,012,323 | 4/1991 | Farnworth | 357/75 |
| 5,025,114 | 6/1991 | Braden | 174/52.4 |
| 5,041,396 | 8/1991 | Valero | 437/209 |
| 5,064,706 | 11/1991 | Ueda et al. | 438/131 |

Primary Examiner—Leo P. Picard
Assistant Examiner—Bot L. Ledynh
Attorney, Agent, or Firm—Ladas & Parry

[57] ABSTRACT

A semi-conductor package having an insulator formed by a supporting portion, a mounting portion and connecting members, and a layer of electrically conductive material on the insulator in a pattern forming a pad and inner leads connected to the pad by supporting bars. A chip is attached on the pad, and the inner leads are wire-connected to the chip. The pad is vertically offset from the inner leads and the chip is supported in recessed fashion on the pad which shortens the length of the connecting wires whereby the wire-connecting efficiency and the structural stability are improved.

10 Claims, 3 Drawing Sheets

FIG. 3
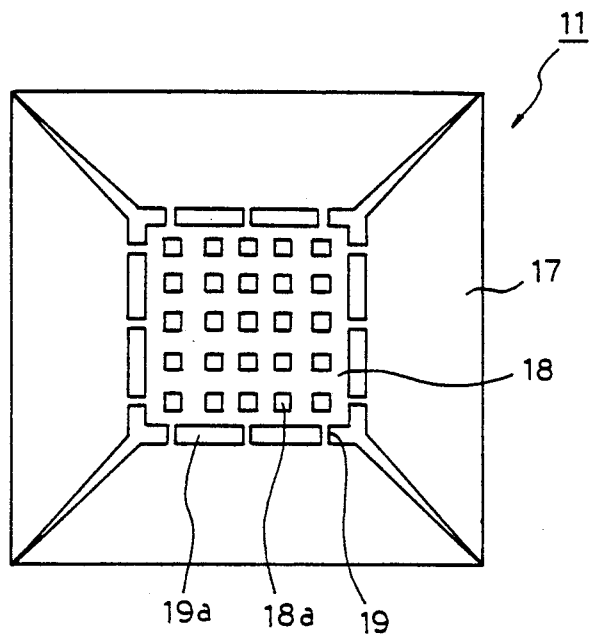
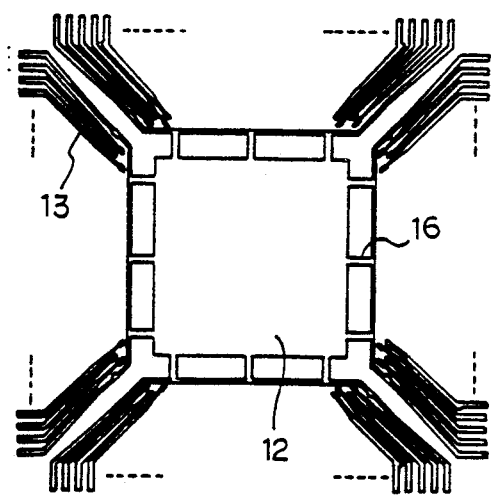
FIG. 4A
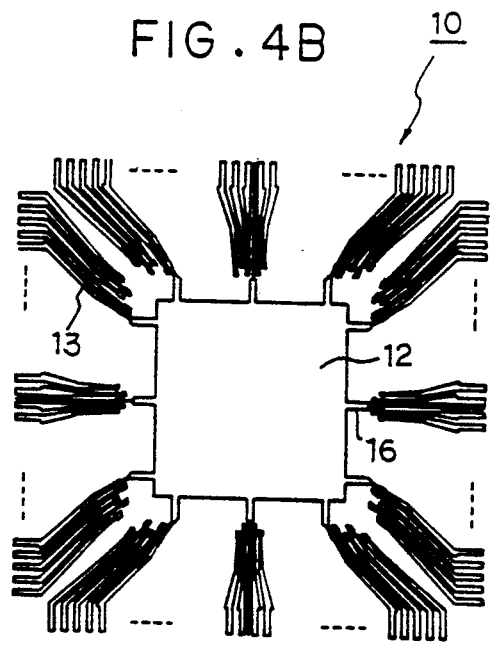
FIG. 4B

SEMICONDUCTOR PACKAGE

FIELD OF THE INVENTION

The present invention relates to a semiconductor package, and particularly to, a semiconductor package in which the wire bonding efficiency is improved to accommodate the trend of increasing chip size and increasing number of leads due to high integration of the semiconductor package.

BACKGROUND OF THE INVENTION

As shown in FIGS. 1A and 1B, in the conventional semiconductor package, a lead frame 1 is constituted such that leads 3 extend in various directions form a pad 2 which is positioned at the center of the lead frame 1. Therefore, the number of the leads 3 has to be increased as the semiconductor chip follows the trend of higher integration. The leads 3 are connected by wires, i.e., wire-bonded, to a semiconductor chip 4 which is attached to the pad 2 by means of adhesives or the like. As the semiconductor chip 4 follows the trend of increasing concentrations, the size of the ship 4 is increased and accordingly, the number leads 3 is also increased. However, in order to mount a semiconductor chip 4 of increased capacity on the lead frame 1 of a limited size, the size of the pad 2 for mounting the semiconductor chip 4 has to be enlarged, while, in order to increase the number of the leads 3, the distances between the ends of the leads 3 and the pad 2 have to be increased.

Accordingly, there is a problem in that the increase of the size of the pad 2 causes the increase of the size of the semiconductor package 5. Further, an increase of the number of the leads 3 makes the gaps between the leads 3 narrower, with the result that the working dimensions allowance is too greatly reduced.

Further, as the distance between the pad 2 and the ends of the leads 3 is extended in correspondence with the increase in the number of the leads 3, the wire-bonding lengths are extended resulting in lowering wire-bonding efficiency as well as producing fragility. This in turn causes the bonded wires to become loosened and deformed, thereby producing contact of the leads are interconnected, circuits whereby the reliability of the products is deteriorated.

SUMMARY OF THE INVENTION

The present invention is intended to overcome the above described disadvantages of the conventional technique.

Therefore, it is an object of the present invention to provide a semiconductor package in which the formation of the leads is made easier, and the leads are formed more closely to the pad, so as to make the semiconductor chip better able to meet the trend of the high integration with high wire-bonding efficiency and high reliability of the products.

According to the present invention, this object is achieved by a semiconductor package wherein a semiconductor chip is attached on a pad, and this chip is wire-bonded to inner leads, thereby forming a package molding. The above object is also achieved in the present invention by a semiconductor package comprising, and insulator integrally formed by connecting a supporting portion and a mounting portion by means of connecting members, a pad for mounting the chip on the insulator, a pattern formed by connecting the inner leads to the pad by means of supporting bars, and leads connected to the inner leads for forming a package molding.

BRIEF DESCRIPTION OF THE DRAWINGS

The above object and other advantages of the present invention will become more apparent by describing in detail a preferred embodiment of the present invention with reference to the attached drawings in which:

FIG. 1 is cross-sectional view showing a semiconductor package according to the present invention;

FIG. 3 is a plan view showing the insulating medium of the semiconductor package according to the present invention;

FIGS. 4A and 4B are plan views showing an example of copper-clad patterns of the semiconductor package according to the present invention.

DESCRIPTION OF THE PREFERRED EMBODIMENT

Figure 1A:
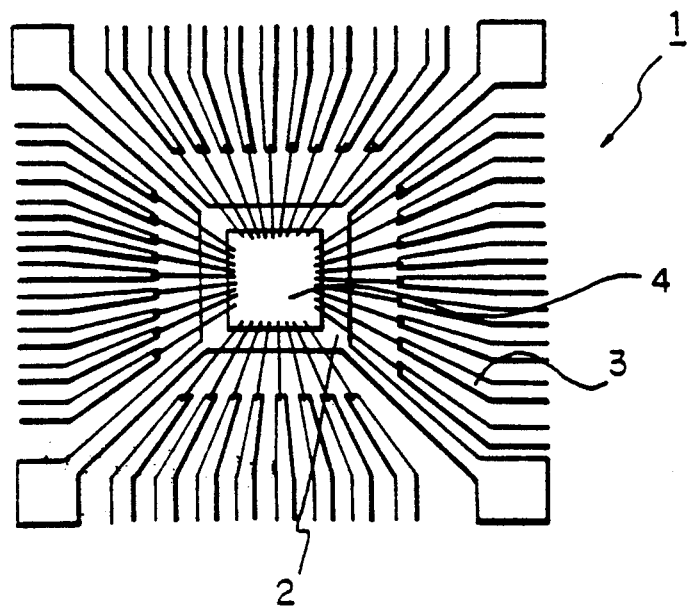
FIG. 1A is a plan view showing a conventional lead frame.
Figure 1B:
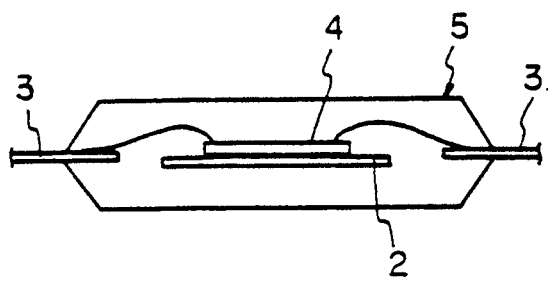
FIG. 1B is a cross-sectional view through the conventional semiconductor package.
Figure 2:
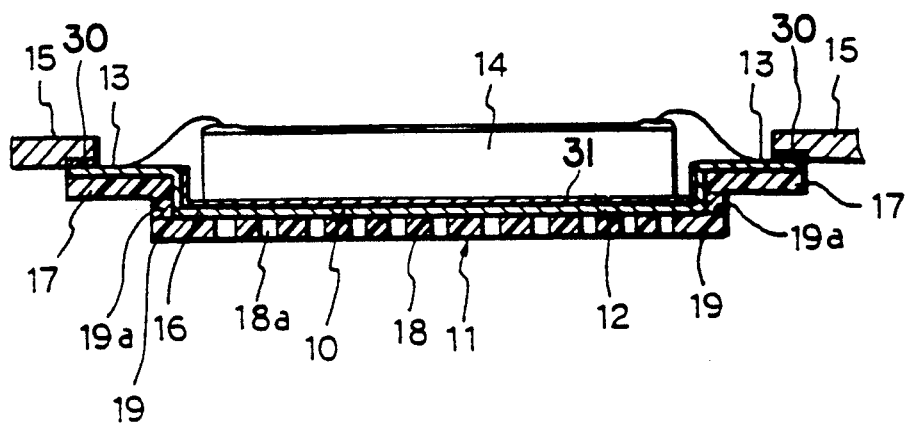
Figure 5A:
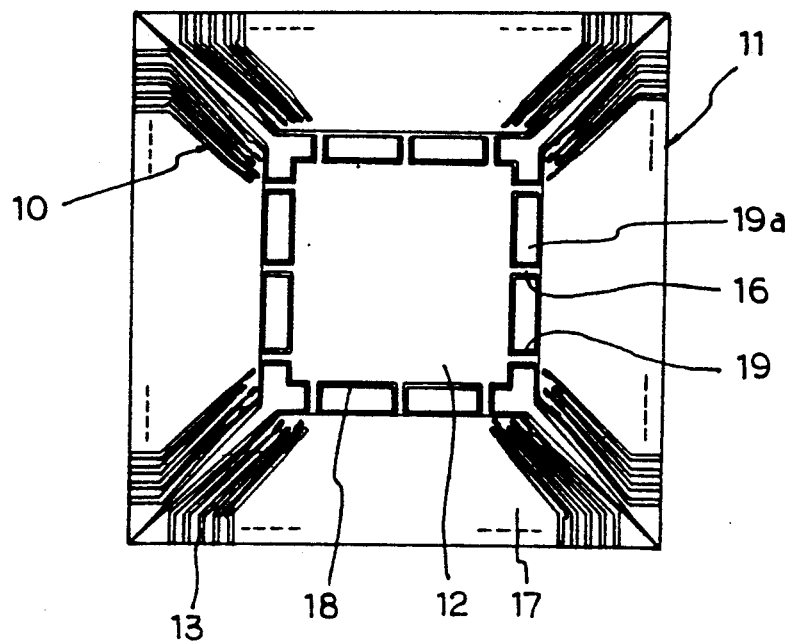
FIGS. 5A and 5B are plan views showing other examples of copper-clad patterns formed on the insulating medium of the semiconductor package according to the present invention.
Figure 5B:
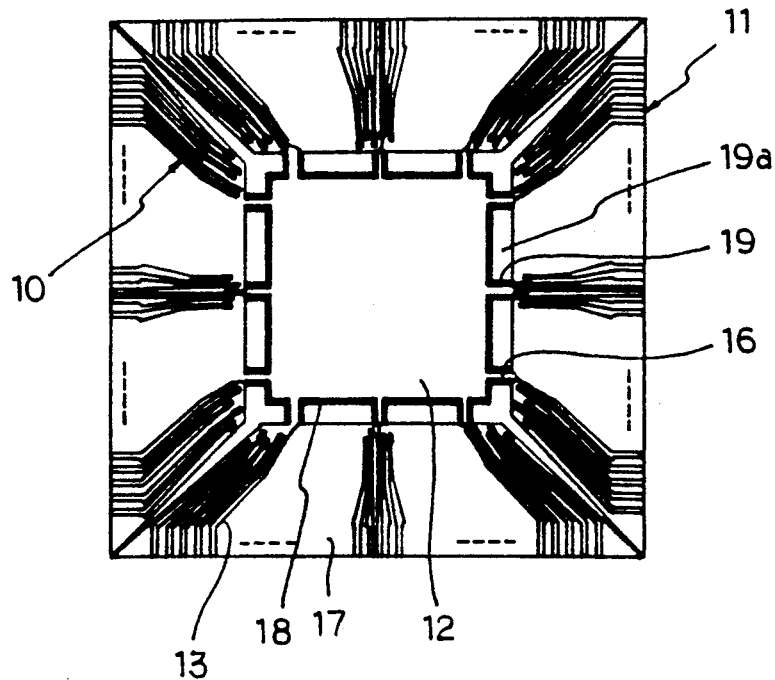

FIGS. 2 to 5 illustrate the semiconductor package according to the present invention. As shown in FIG. 2, an electrolysis copper cladding or a rolled copper cladding is formed on an insulator 11, and a pattern 10 consisting of a pad 12 and inner leads 13 is formed directly in the cladding. A chip 14 is attached on the pad 12 of the pattern 10, and the inner leads 13 of the pattern 10 are connected to leads 15 by welding or adhesives 30 made of an anisotropic resin.

The pad 12 of the pattern 10 is connected to the inner leads 13 through a plurality of supporting bars 16. The pad is positioned lower than the inner leads 13, while the inner leads 13 are wire-bonded with the chip 14, thereby forming a package molding.

Meanwhile, as shown in FIG. 3, the insulator 11 is formed by connecting a supporting portion 17 with a mounting portion 18 by means of connecting members 19, and a plurality of through-holes 18a are formed in the mounting portion 18, while a plurality of slots 19a are formed along the connecting members 19.

Further, as shown in FIGS. 4A and 4B, the pattern 10 is formed by connecting the inner leads 13 with the pad 12 by means of the supporting bars 16, the inner leads 13 being connected to the leads 15 by welding or by an adhesive, the pad 12 serving for the mounting of the chip 14. Silver Ag 31 is electro-deposited on the pad 12 and the support bars 16. FIGS. 4A and 4B illustrate different patterns, respectively.

In the present invention as described above, the pad 12 for mounting the chip 14 and the inner leads 13 for connection with the chip 14 are formed in a patternized form directly on the insulator medium 11. Therefore, in forming a plurality of the inner leads 13, it becomes possible to narrow the gaps between the inner leads 13, and therefore, the number of the inner leads 13 can be increased. Further, as the inner leads 13 are secured to the insulator medium 11, loosening of the inner leads 13 or contact with adjacent inner leads 13 is provided.

Further, the arrangement of the connecting portions 19 of the insulator 11 with the support bars 16 of the pattern 10 is such that the pad 12 is positioned lower than the inner leads 13. Consequently, the length of the wire-bonding between the inner leads and the chip 14 is shortened, and therefore, the wire-bonding is performed simply, so that structural stability and high efficiency are achieved and the possibility of contacts is eliminated between the corners of the chip and the wires.

Meanwhile, the through-holes 18a which are formed on the mounting portion 18 of the insulator 11 reduce the stress caused by the difference between the thermal expansion of the pattern 10 and that of the insulator 11.

According to the present invention as described above, the pad for mounting the chip and the inner leads for wire-bonding with the chip are directly formed on the insulator in a patternized form so that the design of the pad and the inner leads is simplified.

Further, the vertical offset between the inner leads and the pad shortens the length of the wire-bonding, and therefore, the wire-bonding efficiency and the structural stability are substantially improved.

What is claimed is:

1. A semiconductor package including a semiconductor chip attached on a pad and a package molding which is wire-bonded to said chip and inner leads, the improvement comprising:
    an insulator integrally formed by connecting a supporting portion with a mounting portion by means of connecting member;
    a pad on said insulator for mounting said chip thereon;
    a pattern formed by connecting said inner leads which are wire-bonded to said chip by means of supporting bars; and
    leads connected to said inner leads for forming a package molding.

2. The semiconductor package as claimed in claim 1, wherein a plurality of through-holes are formed in said mounting portion of said insulator.

3. The semiconductor package as claimed in claim 1, wherein a plurality of slots are formed between said supporting portion and said mounting portion of said insulator.

4. The semiconductor package as claimed in claim 1, wherein said pattern consists of an electro-deposited copper cladding on said insulator or a rolled copper cladding.

5. The semiconductor package as claimed in claim 4, wherein said supporting bars and said pad of said pattern are electro-deposited with silver.

6. The semiconductor package as claimed in claim 1, wherein a plurality of said connecting members are formed on each edge of said insulatori.

7. The semiconductor package as claimed in claim 1, wherein said inner leads of said pattern are connected to said leads by welds or by means of an adhesive anisotropic resin.

8. The semi-conductor package as claimed in claim 1, wherein said supporting portion is offset vertically from said mounting portion so that said pad is offset from said inner leads.

9. The semi-conductor package as claimed in claim 8, wherein said semi-conductor chip is mounted in recessed fashion in said supporting portion.

10. The semi-conductor package as claimed in claim 9, wherein said pad and said inner leads are vertically offset and said connecting bars extend vertically to connect said inner leads and said pad.

* * * * *